United States Patent
Huemoeller et al.

(10) Patent No.: US 7,714,431 B1
(45) Date of Patent: *May 11, 2010

(54) ELECTRONIC COMPONENT PACKAGE COMPRISING FAN-OUT AND FAN-IN TRACES

(75) Inventors: Ronald Patrick Huemoeller, Chandler, AZ (US); Sukianto Rusli, Phoenix, AZ (US); David Razu, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 700 days.

This patent is subject to a terminal disclaimer.

(21) Appl. No.: 11/605,740

(22) Filed: Nov. 28, 2006

Related U.S. Application Data

(63) Continuation of application No. 11/123,605, filed on May 5, 2005, now Pat. No. 7,192,807, which is a continuation of application No. 10/291,050, filed on Nov. 8, 2002, now Pat. No. 6,905,914.

(51) Int. Cl.
*H01L 23/12* (2006.01)
(52) U.S. Cl. .............. 257/700; 257/E23.067
(58) Field of Classification Search ......... 257/700, 257/E23.067
See application file for complete search history.

(56) References Cited

U.S. PATENT DOCUMENTS

| | | | |
|---|---|---|---|
| 2,596,993 A | 5/1952 | Gookin | 18/36 |
| 3,435,815 A | 4/1969 | Forcier | 125/16 |
| 3,734,660 A | 5/1973 | Davies et al. | 425/123 |
| 3,838,984 A | 10/1974 | Crane et al. | 29/193.5 |
| 4,054,238 A | 10/1977 | Lloyd et al. | 228/173 R |
| 4,189,342 A | 2/1980 | Kock | 156/656 |
| 4,258,381 A | 3/1981 | Inaba | 357/70 |
| 4,289,922 A | 9/1981 | Devlin | 174/52 FP |
| 4,301,464 A | 11/1981 | Otsuki et al. | 357/70 |
| 4,332,537 A | 6/1982 | Slepcevic | 425/121 |
| 4,417,266 A | 11/1983 | Grabbe | 357/80 |
| 4,451,224 A | 5/1984 | Harding | 425/548 |

(Continued)

FOREIGN PATENT DOCUMENTS

DE 197 34 794 7/1998

(Continued)

OTHER PUBLICATIONS

Berry et al., "Thin Stacked Interposer Package", U.S. Appl. No. 11/865,617, filed Oct. 1, 2007.

(Continued)

*Primary Examiner*—Lex Malsawma
(74) *Attorney, Agent, or Firm*—Gunnison, McKay & Hodgson, L.L.P.; Serge J. Hodgson

(57) ABSTRACT

A method of forming an electronic component package includes coupling a first surface of an electronic component to a first surface of a first dielectric strip, the electronic component comprising bond pads on the first surface; forming first via apertures through the first dielectric strip to expose the bond pads; and filling the first via apertures with an electrically conductive material to form first vias electrically coupled to the bond pads. The bond pads are directly connected to the corresponding first vias without the use of a solder and without the need to form a solder wetting layer on the bond pads.

20 Claims, 7 Drawing Sheets

U.S. PATENT DOCUMENTS

| | | | |
|---|---|---|---|
| 4,530,152 A | 7/1985 | Roche et al. | 29/588 |
| 4,541,003 A | 9/1985 | Otsuka et al. | 357/74 |
| 4,646,710 A | 3/1987 | Schmid et al. | 125/16 R |
| 4,707,724 A | 11/1987 | Suzuki et al. | 357/71 |
| 4,727,633 A | 3/1988 | Herrick | 228/122 |
| 4,729,061 A | 3/1988 | Brown | |
| 4,737,839 A | 4/1988 | Burt | 357/67 |
| 4,756,080 A | 7/1988 | Thorp, Jr. et al. | 29/827 |
| 4,812,896 A | 3/1989 | Rothgery et al. | 357/70 |
| 4,862,245 A | 8/1989 | Pashby et al. | 357/70 |
| 4,862,246 A | 8/1989 | Masuda et al. | 357/70 |
| 4,907,067 A | 3/1990 | Derryberry | 357/74 |
| 4,920,074 A | 4/1990 | Shimizu et al. | 437/211 |
| 4,935,803 A | 6/1990 | Kalfus et al. | 357/68 |
| 4,942,454 A | 7/1990 | Mori et al. | 357/70 |
| 4,987,475 A | 1/1991 | Schlesinger et al. | 357/70 |
| 5,018,003 A | 5/1991 | Yasunaga et al. | 357/72 |
| 5,029,386 A | 7/1991 | Chao et al. | 29/827 |
| 5,041,902 A | 8/1991 | McShane | 357/79 |
| 5,057,900 A | 10/1991 | Yamazaki | 357/70 |
| 5,059,379 A | 10/1991 | Tsutsumi et al. | 264/272.14 |
| 5,065,223 A | 11/1991 | Matsuki et al. | 357/68 |
| 5,070,039 A | 12/1991 | Johnson et al. | 437/207 |
| 5,087,961 A | 2/1992 | Long et al. | 357/69 |
| 5,091,341 A | 2/1992 | Asada et al. | 437/212 |
| 5,096,852 A | 3/1992 | Hobson | 437/207 |
| 5,118,298 A | 6/1992 | Murphy | 439/68 |
| 5,122,860 A | 6/1992 | Kikuchi et al. | 357/72 |
| 5,134,773 A | 8/1992 | LeMaire et al. | 29/827 |
| 5,151,039 A | 9/1992 | Murphy | 439/70 |
| 5,157,475 A | 10/1992 | Yamaguchi | 357/68 |
| 5,157,480 A | 10/1992 | McShane et al. | 357/74 |
| 5,168,368 A | 12/1992 | Gow, 3rd et al. | 257/666 |
| 5,172,213 A | 12/1992 | Zimmerman | 257/796 |
| 5,172,214 A | 12/1992 | Casto | 257/676 |
| 5,175,060 A | 12/1992 | Enomoto et al. | 428/620 |
| 5,200,362 A | 4/1993 | Lin et al. | 437/207 |
| 5,200,809 A | 4/1993 | Kwon | 257/707 |
| 5,214,845 A | 6/1993 | King et al. | 29/841 |
| 5,216,278 A | 6/1993 | Lin et al. | 257/688 |
| 5,218,231 A | 6/1993 | Kudo | 257/735 |
| 5,221,642 A | 6/1993 | Burns | 437/207 |
| 5,250,841 A | 10/1993 | Sloan et al. | 257/666 |
| 5,252,853 A | 10/1993 | Michii | 257/666 |
| 5,258,094 A | 11/1993 | Furui et al. | 156/634 |
| 5,266,834 A | 11/1993 | Nishi et al. | 257/706 |
| 5,268,310 A | 12/1993 | Goodrich et al. | 437/15 |
| 5,273,938 A | 12/1993 | Lin et al. | 437/207 |
| 5,277,972 A | 1/1994 | Sakumoto et al. | 428/355 |
| 5,278,446 A | 1/1994 | Nagaraj et al. | 257/707 |
| 5,279,029 A | 1/1994 | Burns | 29/856 |
| 5,281,849 A | 1/1994 | Singh Deo et al. | 257/666 |
| 5,294,897 A | 3/1994 | Notani et al. | 333/33 |
| 5,327,008 A | 7/1994 | Djennas et al. | 257/666 |
| 5,332,864 A | 7/1994 | Liang et al. | 174/52.4 |
| 5,335,771 A | 8/1994 | Murphy | 206/328 |
| 5,336,931 A | 8/1994 | Juskey et al. | 257/787 |
| 5,343,076 A | 8/1994 | Katayama et al. | 257/717 |
| 5,353,498 A | 10/1994 | Fillion et al. | 29/840 |
| 5,358,905 A | 10/1994 | Chiu | 437/209 |
| 5,365,106 A | 11/1994 | Watanabe | 257/669 |
| 5,381,042 A | 1/1995 | Lerner et al. | 257/712 |
| 5,391,439 A | 2/1995 | Tomita et al. | 428/571 |
| 5,394,303 A | 2/1995 | Yamaji | 361/749 |
| 5,406,124 A | 4/1995 | Morita et al. | 257/783 |
| 5,410,180 A | 4/1995 | Fujii et al. | 257/666 |
| 5,414,299 A | 5/1995 | Wang et al. | 257/702 |
| 5,417,905 A | 5/1995 | Lemaire et al. | 264/139 |
| 5,424,576 A | 6/1995 | Djennas et al. | 257/666 |
| 5,428,248 A | 6/1995 | Cha | 257/676 |
| 5,432,677 A | 7/1995 | Mowatt et al. | |
| 5,435,057 A | 7/1995 | Bindra et al. | 29/830 |
| 5,444,301 A | 8/1995 | Song et al. | 257/737 |
| 5,452,511 A | 9/1995 | Chang | 29/827 |
| 5,454,905 A | 10/1995 | Fogelson | 156/651.1 |
| 5,474,958 A | 12/1995 | Djennas et al. | 437/211 |
| 5,484,274 A | 1/1996 | Neu | 425/116 |
| 5,493,151 A | 2/1996 | Asada et al. | 257/686 |
| 5,508,556 A | 4/1996 | Lin | 257/691 |
| 5,517,056 A | 5/1996 | Bigler et al. | 257/666 |
| 5,521,429 A | 5/1996 | Aono et al. | 257/676 |
| 5,528,076 A | 6/1996 | Pavio | 257/666 |
| 5,534,467 A | 7/1996 | Rostoker | 437/209 |
| 5,539,251 A | 7/1996 | Iverson et al. | 257/670 |
| 5,543,657 A | 8/1996 | Diffenderfer et al. | 257/666 |
| 5,544,412 A | 8/1996 | Romero et al. | 29/832 |
| 5,545,923 A | 8/1996 | Barber | 257/691 |
| 5,576,517 A | 11/1996 | Wojnarowski et al. | 174/262 |
| 5,578,525 A | 11/1996 | Mizukoshi | |
| 5,581,122 A | 12/1996 | Chao et al. | 257/691 |
| 5,592,019 A | 1/1997 | Ueda et al. | 257/666 |
| 5,592,025 A | 1/1997 | Clark et al. | 257/774 |
| 5,594,274 A | 1/1997 | Suetaki | 257/667 |
| 5,595,934 A | 1/1997 | Kim | 437/180 |
| 5,604,376 A | 2/1997 | Hamburgen et al. | 257/676 |
| 5,608,265 A | 3/1997 | Kitano et al. | 257/738 |
| 5,608,267 A | 3/1997 | Mahulikar et al. | 257/796 |
| 5,619,068 A | 4/1997 | Benzoni | 257/690 |
| 5,625,222 A | 4/1997 | Yoneda et al. | 257/687 |
| 5,633,528 A | 5/1997 | Abbott et al. | 257/666 |
| 5,639,990 A | 6/1997 | Nishihara et al. | 174/52.2 |
| 5,640,047 A | 6/1997 | Nakashima | 257/738 |
| 5,641,997 A | 6/1997 | Ohta et al. | 257/788 |
| 5,643,433 A | 7/1997 | Fukase et al. | 205/78 |
| 5,644,169 A | 7/1997 | Chun | 257/787 |
| 5,646,831 A | 7/1997 | Manteghi | 361/813 |
| 5,650,663 A | 7/1997 | Parthasarathi | 257/706 |
| 5,661,088 A | 8/1997 | Tessier et al. | 29/841 |
| 5,665,996 A | 9/1997 | Williams et al. | 257/401 |
| 5,673,479 A | 10/1997 | Hawthorne | 29/832 |
| 5,683,806 A | 11/1997 | Sakumoto et al. | 428/343 |
| 5,689,135 A | 11/1997 | Ball | 257/676 |
| 5,696,666 A | 12/1997 | Miles et al. | 361/764 |
| 5,701,034 A | 12/1997 | Marrs | 257/706 |
| 5,703,407 A | 12/1997 | Hori | 257/783 |
| 5,710,064 A | 1/1998 | Song et al. | 437/220 |
| 5,723,899 A | 3/1998 | Shin | 257/666 |
| 5,724,233 A | 3/1998 | Honda et al. | 361/813 |
| 5,726,493 A | 3/1998 | Yamashita et al. | 257/698 |
| 5,736,432 A | 4/1998 | Mackessy | 438/123 |
| 5,736,448 A | 4/1998 | Saia et al. | 438/393 |
| 5,745,984 A | 5/1998 | Cole, Jr. et al. | 29/834 |
| 5,753,532 A | 5/1998 | Sim | 437/217 |
| 5,753,977 A | 5/1998 | Kusaka et al. | 257/787 |
| 5,766,972 A | 6/1998 | Takahashi et al. | 438/127 |
| 5,769,989 A | 6/1998 | Hoffmeyer et al. | 156/94 |
| 5,770,888 A | 6/1998 | Song et al. | 257/696 |
| 5,776,798 A | 7/1998 | Quan et al. | 438/112 |
| 5,783,861 A | 7/1998 | Son | 253/693 |
| 5,786,238 A | 7/1998 | Pai et al. | 438/118 |
| 5,801,440 A | 9/1998 | Chu et al. | 257/691 |
| 5,814,877 A | 9/1998 | Diffenderfer et al. | 257/666 |
| 5,814,881 A | 9/1998 | Alagaratnam et al. | 257/686 |
| 5,814,883 A | 9/1998 | Sawai et al. | 257/712 |
| 5,814,884 A | 9/1998 | Davis et al. | 257/723 |
| 5,817,540 A | 10/1998 | Wark | 438/107 |
| 5,818,105 A | 10/1998 | Kouda | 257/696 |
| 5,821,457 A | 10/1998 | Mosley et al. | 174/52.4 |
| 5,821,615 A | 10/1998 | Lee | 257/686 |
| 5,834,830 A | 11/1998 | Cho | 257/667 |
| 5,835,988 A | 11/1998 | Ishii | 257/684 |
| 5,841,193 A | 11/1998 | Eichelberger | 257/723 |
| 5,844,306 A | 12/1998 | Fujita et al. | 257/676 |
| 5,856,911 A | 1/1999 | Riley | 361/704 |

| Patent No. | Kind | Date | Inventor | Class |
|---|---|---|---|---|
| 5,859,471 | A | 1/1999 | Kuraishi et al. | 257/666 |
| 5,859,475 | A | 1/1999 | Freyman et al. | |
| 5,866,939 | A | 2/1999 | Shin et al. | 257/666 |
| 5,871,782 | A | 2/1999 | Choi | 425/116 |
| 5,874,770 | A | 2/1999 | Saia et al. | 257/536 |
| 5,874,784 | A | 2/1999 | Aoki et al. | 257/787 |
| 5,877,043 | A | 3/1999 | Alcoe et al. | 438/123 |
| 5,886,397 | A | 3/1999 | Ewer | 257/667 |
| 5,886,398 | A | 3/1999 | Low et al. | 257/667 |
| 5,894,108 | A | 4/1999 | Mostafazadeh et al. | 174/52.4 |
| 5,897,339 | A | 4/1999 | Song et al. | 438/118 |
| 5,900,676 | A | 5/1999 | Kweon et al. | 257/787 |
| 5,903,049 | A | 5/1999 | Mori | 257/686 |
| 5,903,050 | A | 5/1999 | Thurairajaratnam et al. | 257/695 |
| 5,909,053 | A | 6/1999 | Fukase et al. | 257/666 |
| 5,915,998 | A | 6/1999 | Stidham et al. | 439/723 |
| 5,917,242 | A | 6/1999 | Ball | 257/737 |
| 5,937,324 | A | 8/1999 | Abercrombie et al. | 438/648 |
| 5,939,779 | A | 8/1999 | Kim | 257/692 |
| 5,942,794 | A | 8/1999 | Okumura et al. | 257/666 |
| 5,951,305 | A | 9/1999 | Haba | 439/70 |
| 5,959,356 | A | 9/1999 | Oh | 257/738 |
| 5,969,426 | A | 10/1999 | Baba et al. | 257/778 |
| 5,973,388 | A | 10/1999 | Chew et al. | 257/676 |
| 5,976,912 | A | 11/1999 | Fukutomi et al. | 438/110 |
| 5,977,613 | A | 11/1999 | Takata et al. | 257/666 |
| 5,977,615 | A | 11/1999 | Yamaguchi et al. | 257/666 |
| 5,977,630 | A | 11/1999 | Woodworth et al. | 257/712 |
| 5,981,314 | A | 11/1999 | Glenn et al. | 438/127 |
| 5,982,632 | A | 11/1999 | Mosley et al. | 361/775 |
| 5,986,333 | A | 11/1999 | Nakamura | 257/667 |
| 5,986,885 | A | 11/1999 | Wyland | 361/704 |
| 6,001,671 | A | 12/1999 | Fjelstad | 438/112 |
| 6,013,947 | A | 1/2000 | Lim | 257/685 |
| 6,018,189 | A | 1/2000 | Mizuno | 257/668 |
| 6,020,625 | A | 2/2000 | Qin et al. | 257/666 |
| 6,025,640 | A | 2/2000 | Yagi et al. | 257/666 |
| 6,031,279 | A | 2/2000 | Lenz | 257/686 |
| RE36,613 | E | 3/2000 | Ball | 257/777 |
| 6,034,423 | A | 3/2000 | Mostafazadeh et al. | 257/691 |
| 6,040,626 | A | 3/2000 | Cheah et al. | 257/735 |
| 6,043,430 | A | 3/2000 | Chun | 174/52.4 |
| 6,060,768 | A | 5/2000 | Hayashida et al. | 257/666 |
| 6,060,769 | A | 5/2000 | Wark | 257/666 |
| 6,072,228 | A | 6/2000 | Hinkle et al. | 257/666 |
| 6,075,284 | A | 6/2000 | Choi et al. | 257/676 |
| 6,081,029 | A | 6/2000 | Yamaguchi | 257/718 |
| 6,084,310 | A | 7/2000 | Mizuno et al. | 257/779 |
| 6,087,715 | A | 7/2000 | Sawada et al. | 257/666 |
| 6,087,722 | A | 7/2000 | Lee et al. | 257/723 |
| 6,100,594 | A | 8/2000 | Fukui et al. | 257/777 |
| 6,113,474 | A | 9/2000 | Shih et al. | 451/72 |
| 6,114,752 | A | 9/2000 | Huang et al. | 257/666 |
| 6,118,174 | A | 9/2000 | Kim | 257/676 |
| 6,118,184 | A | 9/2000 | Ishio et al. | 257/787 |
| RE36,907 | E | 10/2000 | Templeton, Jr. et al. | 257/666 |
| 6,130,115 | A | 10/2000 | Okumura et al. | 438/124 |
| 6,130,473 | A | 10/2000 | Mostafazadeh et al. | 257/666 |
| 6,133,623 | A | 10/2000 | Otsuki et al. | 257/666 |
| 6,140,154 | A | 10/2000 | Hinkle et al. | 438/123 |
| 6,143,981 | A | 11/2000 | Glenn | 174/52.4 |
| 6,169,329 | B1 | 1/2001 | Farnworth et al. | 257/780 |
| 6,177,718 | B1 | 1/2001 | Kozono | 257/666 |
| 6,181,002 | B1 | 1/2001 | Juso et al. | 257/686 |
| 6,184,465 | B1 | 2/2001 | Corisis | 174/52.4 |
| 6,184,573 | B1 | 2/2001 | Pu | 257/666 |
| 6,194,250 | B1 | 2/2001 | Melton et al. | |
| 6,194,777 | B1 | 2/2001 | Abbott et al. | 257/666 |
| 6,197,615 | B1 | 3/2001 | Song et al. | 438/111 |
| 6,198,171 | B1 | 3/2001 | Huang et al. | 257/787 |
| 6,201,186 | B1 | 3/2001 | Daniels et al. | 174/52.4 |
| 6,201,292 | B1 | 3/2001 | Yagi et al. | 257/666 |
| 6,204,554 | B1 | 3/2001 | Ewer et al. | 257/705 |
| 6,208,020 | B1 | 3/2001 | Minamio et al. | 257/684 |
| 6,208,021 | B1 | 3/2001 | Ohuchi et al. | 257/690 |
| 6,208,023 | B1 | 3/2001 | Nakayama et al. | 257/696 |
| 6,211,462 | B1 | 4/2001 | Carter, Jr. et al. | 174/52.4 |
| 6,214,525 | B1 | 4/2001 | Boyko et al. | |
| 6,218,731 | B1 | 4/2001 | Huang et al. | 257/738 |
| 6,222,258 | B1 | 4/2001 | Asano et al. | 257/675 |
| 6,222,259 | B1 | 4/2001 | Park et al. | 257/690 |
| 6,225,146 | B1 | 5/2001 | Yamaguchi et al. | 438/123 |
| 6,229,200 | B1 | 5/2001 | Mclellan et al. | 257/666 |
| 6,229,205 | B1 | 5/2001 | Jeong et al. | 257/676 |
| 6,239,367 | B1 | 5/2001 | Hsuan et al. | 174/52.4 |
| 6,239,384 | B1 * | 5/2001 | Smith et al. | 174/261 |
| 6,242,281 | B1 | 6/2001 | Mclellan et al. | 438/106 |
| 6,256,200 | B1 | 7/2001 | Lam et al. | 361/704 |
| 6,258,192 | B1 | 7/2001 | Natarajan | 156/89.15 |
| 6,258,629 | B1 | 7/2001 | Niones et al. | 438/111 |
| 6,261,918 | B1 | 7/2001 | So | 438/401 |
| 6,281,566 | B1 | 8/2001 | Magni | 257/666 |
| 6,281,568 | B1 | 8/2001 | Glenn et al. | 257/684 |
| 6,282,095 | B1 | 8/2001 | Houghton et al. | 361/704 |
| 6,285,075 | B1 | 9/2001 | Combs et al. | 257/675 |
| 6,291,271 | B1 | 9/2001 | Lee et al. | 438/121 |
| 6,291,273 | B1 | 9/2001 | Miyaki et al. | 438/123 |
| 6,294,100 | B1 | 9/2001 | Fan et al. | 216/14 |
| 6,294,830 | B1 | 9/2001 | Fjelstad | 257/724 |
| 6,295,977 | B1 | 10/2001 | Ripper et al. | 125/16.02 |
| 6,297,548 | B1 | 10/2001 | Moden et al. | 257/686 |
| 6,303,984 | B1 | 10/2001 | Corisis | 257/670 |
| 6,303,997 | B1 | 10/2001 | Lee | 257/778 |
| 6,307,272 | B1 | 10/2001 | Takahashi et al. | 257/787 |
| 6,309,909 | B1 | 10/2001 | Ohgiyama | 438/112 |
| 6,316,822 | B1 | 11/2001 | Venkateshwaran et al. | 257/666 |
| 6,316,838 | B1 | 11/2001 | Ozawa et al. | 257/778 |
| 6,323,550 | B1 | 11/2001 | Martin et al. | 257/704 |
| 6,326,243 | B1 | 12/2001 | Suzuya et al. | 438/124 |
| 6,326,244 | B1 | 12/2001 | Brooks et al. | 438/124 |
| 6,326,678 | B1 | 12/2001 | Karnezos et al. | 257/666 |
| 6,335,564 | B1 | 1/2002 | Pour | 257/666 |
| 6,337,510 | B1 | 1/2002 | Chun-Jen et al. | 257/666 |
| 6,339,255 | B1 | 1/2002 | Shin | 257/686 |
| 6,348,726 | B1 | 2/2002 | Bayan et al. | 257/666 |
| 6,355,502 | B1 | 3/2002 | Kang et al. | 438/110 |
| 6,365,974 | B1 | 4/2002 | Abbott et al. | 257/774 |
| 6,369,447 | B2 | 4/2002 | Mori | 257/777 |
| 6,369,454 | B1 | 4/2002 | Chung | 257/787 |
| 6,373,127 | B1 | 4/2002 | Baudouin et al. | 257/676 |
| 6,380,048 | B1 | 4/2002 | Boon et al. | 438/456 |
| 6,384,472 | B1 | 5/2002 | Huang | 257/680 |
| 6,388,336 | B1 | 5/2002 | Venkateshwaran et al. | 257/779 |
| 6,395,578 | B1 | 5/2002 | Shin et al. | 438/106 |
| 6,396,148 | B1 | 5/2002 | Eichelberger et al. | 257/758 |
| 6,396,153 | B2 | 5/2002 | Fillion et al. | 257/774 |
| 6,400,004 | B1 | 6/2002 | Fan et al. | 257/666 |
| 6,410,979 | B2 | 6/2002 | Abe | 257/684 |
| 6,414,385 | B1 | 7/2002 | Huang et al. | 257/690 |
| 6,420,779 | B1 | 7/2002 | Sharma et al. | 257/666 |
| 6,429,508 | B1 | 8/2002 | Gang | 257/678 |
| 6,437,429 | B1 | 8/2002 | Su et al. | 257/666 |
| 6,444,499 | B1 | 9/2002 | Swiss et al. | 438/127 |
| 6,448,633 | B1 | 9/2002 | Yee et al. | 257/666 |
| 6,452,279 | B2 | 9/2002 | Shimoda | 257/777 |
| 6,459,148 | B1 | 10/2002 | Chun-Jen et al. | 257/692 |
| 6,464,121 | B2 | 10/2002 | Reijnders | 225/103 |
| 6,476,469 | B2 | 11/2002 | Hung et al. | 257/666 |
| 6,476,474 | B1 | 11/2002 | Hung | 257/686 |
| 6,482,680 | B1 | 11/2002 | Khor et al. | 438/123 |
| 6,498,099 | B1 | 12/2002 | McLellan et al. | 438/689 |
| 6,498,392 | B2 | 12/2002 | Azuma | 257/676 |
| 6,507,096 | B2 | 1/2003 | Gang | 257/678 |
| 6,507,120 | B2 | 1/2003 | Lo et al. | 257/778 |
| 6,521,530 | B2 | 2/2003 | Peters et al. | 438/667 |
| 6,524,885 | B2 | 2/2003 | Pierce | 438/106 |

| | | | | | | |
|---|---|---|---|---|---|---|
| 6,534,849 | B1 | 3/2003 | Gang | ...................... | 257/678 | |
| 6,545,332 | B2 | 4/2003 | Huang | ...................... | 257/433 | |
| 6,545,345 | B1 | 4/2003 | Glenn et al. | ............... | 257/676 | |
| 6,559,525 | B2 | 5/2003 | Huang | ...................... | 257/675 | |
| 6,566,168 | B2 | 5/2003 | Gang | ...................... | 438/112 | |
| 6,583,503 | B2 | 6/2003 | Akram et al. | ............... | 257/686 | |
| 6,593,645 | B2 | 7/2003 | Shih et al. | .................... | 257/686 | |
| 6,603,196 | B2 | 8/2003 | Lee et al. | .................... | 257/676 | |
| 6,624,005 | B1 | 9/2003 | DiCaprio et al. | ............ | 438/113 | |
| 6,667,546 | B2 | 12/2003 | Huang et al. | ................ | 257/691 | |
| 6,671,398 | B2 | 12/2003 | Reinhorn et al. | ............ | 382/145 | |
| 6,727,576 | B2 | 4/2004 | Hedler et al. | ............... | 257/678 | |
| 6,730,857 | B2 | 5/2004 | Konrad et al. | | | |
| 6,740,964 | B2 | 5/2004 | Sasaki | | | |
| 6,831,371 | B1 | 12/2004 | Huemoeller et al. | ........ | 257/778 | |
| 6,838,776 | B2 | 1/2005 | Leal et al. | .................... | 257/686 | |
| 6,845,554 | B2 | 1/2005 | Frankowsky et al. | .......... | 29/832 | |
| 6,905,914 | B1 | 6/2005 | Huemoeller et al. | .......... | 438/118 | |
| 6,919,514 | B2 | 7/2005 | Konrad et al. | | | |
| 6,921,975 | B2 | 7/2005 | Leal et al. | .................... | 257/723 | |
| 6,930,256 | B1 | 8/2005 | Huemoeller et al. | ........ | 174/260 | |
| 7,015,075 | B2 | 3/2006 | Fay et al. | .................... | 438/127 | |
| 7,041,534 | B2 | 5/2006 | Chao et al. | .................. | 438/114 | |
| 7,129,158 | B2 | 10/2006 | Nakai | | | |
| 7,242,081 | B1 | 7/2007 | Lee | | | |
| 7,247,523 | B1 | 7/2007 | Huemoeller et al. | ........ | 438/118 | |
| 7,272,444 | B2 | 9/2007 | Peterson et al. | ............... | 607/30 | |
| 7,345,361 | B2 | 3/2008 | Mallik et al. | | | |
| 7,372,151 | B1 | 5/2008 | Fan et al. | | | |
| 7,420,272 | B1 * | 9/2008 | Huemoeller et al. | ........ | 257/700 | |
| 2001/0008305 | A1 | 7/2001 | McLellan et al. | ............ | 257/692 | |
| 2001/0011654 | A1 | 8/2001 | Schmidt et al. | ............. | 219/746 | |
| 2001/0012704 | A1 | 8/2001 | Eldridge | | | |
| 2001/0014538 | A1 | 8/2001 | Kwan et al. | ................. | 438/690 | |
| 2002/0024122 | A1 | 2/2002 | Jung et al. | .................. | 257/666 | |
| 2002/0027297 | A1 | 3/2002 | Ikenaga et al. | .............. | 257/784 | |
| 2002/0061642 | A1 | 5/2002 | Haji et al. | .................... | 438/613 | |
| 2002/0140061 | A1 | 10/2002 | Lee | ...................... | 257/666 | |
| 2002/0140068 | A1 | 10/2002 | Lee et al. | .................... | 257/676 | |
| 2002/0163015 | A1 | 11/2002 | Lee et al. | .................... | 257/200 | |
| 2003/0013232 | A1 | 1/2003 | Towle et al. | ................ | 438/113 | |
| 2003/0030131 | A1 | 2/2003 | Lee et al. | .................... | 257/666 | |
| 2003/0064548 | A1 | 4/2003 | Isaak | | | |
| 2003/0073265 | A1 | 4/2003 | Hu et al. | ..................... | 438/123 | |
| 2003/0134455 | A1 | 7/2003 | Cheng et al. | ................ | 438/125 | |
| 2004/0004293 | A1 | 1/2004 | Murayama | .................. | 257/780 | |
| 2004/0026781 | A1 | 2/2004 | Nakai | | | |
| 2004/0046244 | A1 | 3/2004 | Nakamura et al. | | | |
| 2004/0056277 | A1 | 3/2004 | Karnezos | .................... | 257/200 | |
| 2004/0061212 | A1 | 4/2004 | Karnezos | .................... | 257/686 | |
| 2004/0061213 | A1 | 4/2004 | Karnezos | .................... | 257/686 | |
| 2004/0063242 | A1 | 4/2004 | Karnezos | .................... | 438/106 | |
| 2004/0063246 | A1 | 4/2004 | Karnezos | .................... | 438/108 | |
| 2004/0113260 | A1 | 6/2004 | Sunohara et al. | ............ | 257/698 | |
| 2005/0242425 | A1 | 11/2005 | Leal et al. | .................... | 257/690 | |
| 2005/0282314 | A1 | 12/2005 | Lo et al. | ..................... | 438/117 | |
| 2007/0273049 | A1 | 11/2007 | Khan et al. | | | |
| 2007/0290376 | A1 | 12/2007 | Zhao et al. | | | |
| 2008/0230887 | A1 | 9/2008 | Sun et al. | | | |

FOREIGN PATENT DOCUMENTS

| | | |
|---|---|---|
| EP | 0 393 997 | 10/1990 |
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 2/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |

OTHER PUBLICATIONS

Scanlan, "Package-on-package (PoP) with Through-mold Vias", *Advanced Packaging*, Jan. 2008, 3 pages, vol. 17, Issue 1, PennWell Corpotation.

Kim et al., "Application of Through Mold Via (TMV) as PoP base package", 58th *ECTC Proceedings*, May 2008, Lake Buena Vista, FL, 6 pages, IEEE.

Sheridan et al., U.S. Appl. No. 10/868,244, filed Jun. 15, 2004, entitled "Embedded Leadframe Semiconductior Package".

Huemoeller et al., U.S. Appl. No. 11/297,050, filed Dec. 7, 2005, entitled "Stacked Embedded Leadframe".

Huemoeller et al., U.S. Appl. No. 11/298,016, filed Dec. 8, 2005, entitled "Embedded Electronic Component Package".

Lee et al., U.S. Appl. No. 11/440,548, filed May 24, 2006, entitled "Substrate for Semiconductor Device and Manufacturing Method Thereof".

Huemoeller et al., U.S. Appl. No. 11/784,979, filed Apr. 9, 2007, entitled "Two-Sided Wafer Escape Package".

Berry et al., U.S. Appl. No. 11/810,799, filed Jun. 6, 2006, entitled "Direct-Write Wafer Level Chip Scale Package".

Huemoeller et al., U.S. Appl. No. 12/221,797, filed Aug. 5, 2008, entitled "Two-Sided Fan-Out Wafer Escape Package".

Huemoeller et al., U.S. Appl. No. 11/123,605, filed May 5, 2005, entitled "Wafer Level Package and Fabrication Method".

Huemoeller et al., U.S. Appl. No. 10/261,868, filed Oct. 1, 2002, entitled "Integrated Circuit Film Substrate Having Embedded Conductive Patterns and Vias".

Huemoeller et al., "Embedded Electronic Component Package Fabrication Method", U.S. Appl. No. 12/459,532, filed Jul. 2, 2009.

* cited by examiner

ELECTRONIC COMPONENT PACKAGE COMPRISING FAN-OUT AND FAN-IN TRACES

This application is a continuation of Huemoeller et al., U.S. patent application Ser. No. 11/123,605, filed on May 5, 2005, now U.S. Pat. No. 7,192,807 entitled "WAFER LEVEL PACKAGE AND FABRICATION METHOD", which is a continuation of Huemoeller et al., U.S. patent application Ser. No. 10/291,050, filed on Nov. 8, 2002, entitled "WAFER LEVEL PACKAGE AND FABRICATION METHOD", now U.S. Pat. No. 6,905,914, issued Jun. 14, 2005, both of which are herein incorporated by reference in their entirety.

BACKGROUND OF THE INVENTION

1. Field of the Invention

The present invention relates generally to the packaging of electronic components. More particularly, the present invention relates to a wafer level package and method of fabricating the same.

2. Description of the Related Art

One form of an electronic component package included an electronic component such as an integrated circuit chip mounted to a substrate. For example, in a wirebond configuration, the rear surface of the integrated circuit chip was mounted to the substrate, e.g., with an adhesive. Bond wires were used to form the electrical interconnections between the bond pads on the front surface of the integrated circuit chip and the electrically conductive traces on the substrate.

As the art moved to smaller and lighter weight electronic devices, it became increasingly important that the size of the electronic component package used within these electronic devices was small. However, in the wirebond configuration described above, the traces of the substrate were fanned out around the integrated circuit chip, which placed a fundamental restriction on the minimum electronic component package size. Further, a large impedance was associated with the bond wires.

To allow a further reduction in the electronic component package size as well as to reduce impedance of the interconnections, a flip chip configuration was used instead of a wirebond configuration. In a flip chip configuration, the bond pads on the front surface of the integrated circuit chip were directly connected to the traces on the substrate with flip chip bumps, e.g., solder. This avoided the need to fan out the traces around the integrated circuit chip resulting in a minimum package size. Further, the use of flip chip bumps between the bond pads and the traces on the substrate minimized impedance.

However, the flip chip bumps between the bond pads of the integrated circuit chip and the traces on the substrate were subject to significant stress, e.g., due to differential thermal expansion between the integrated circuit chip and the substrate. Thus, failure of the flip chip bumps often occurred which decreased yield and thus increased the cost of the electronic component package.

To minimize the failure of the flip chip bumps, an underfill material was often applied between the integrated circuit chip and the substrate and around the flip chip bumps. However, the application of the underfill material required an additional manufacturing step, which increased the cost of the electronic component package.

SUMMARY OF THE INVENTION

In accordance with one embodiment of the present invention, a method of forming an electronic component package includes coupling a first surface of an electronic component to a first surface of a first dielectric strip, the electronic component comprising bond pads on the first surface; forming first via apertures through the first dielectric strip to expose the bond pads; and filling the first via apertures with an electrically conductive material to form first vias electrically coupled to the bond pads.

Thus, in accordance with this embodiment of the present invention, the bond pads are directly connected to the corresponding first vias. Stated another way, the bond pads are electrically connected to the corresponding first vias without the use of a solder, e.g., without the use of flip chip bumps, and without the need to form a solder wetting layer, e.g., a nickel/gold layer, on the bond pads. This maximizes the reliability of the electrical connection between the first vias and the bond pads, while at the same time minimizes impedance.

Further, since the dielectric strip is directly attached to the electronic component and the bond pads are directly connected to the corresponding first vias, the use of an underfill material is obviated. This simplifies manufacturing, enhances reliability, and thus reduces cost.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 5:
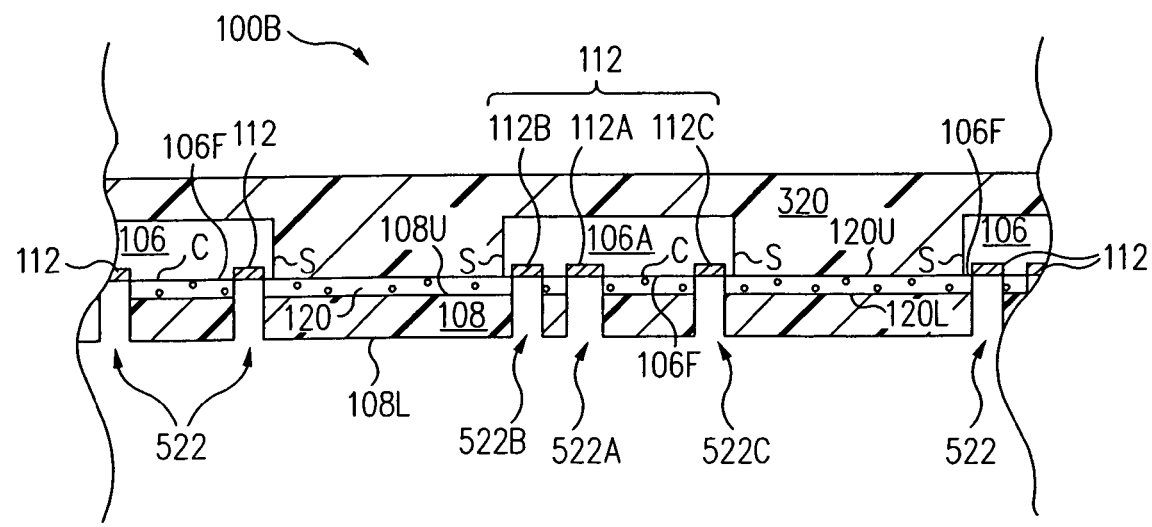
Figure 6:
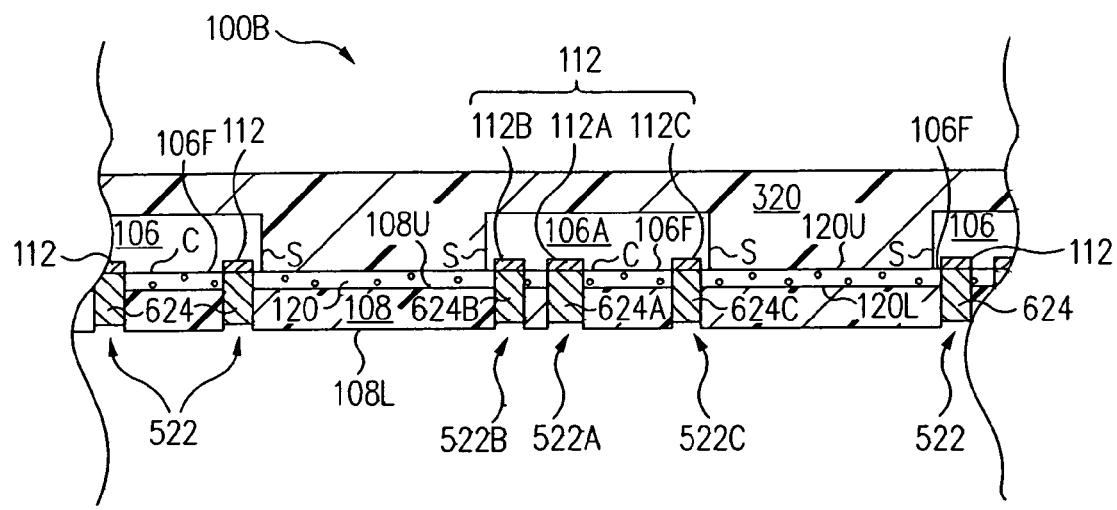

In accordance with one embodiment of the present invention, a method of forming an electronic component package includes coupling first surfaces 106F of electronic components 106 to a first surface 108U of a dielectric strip 108 with adhesives 110 or 120 (FIGS. 1A and 1B), electronic components 106 having bond pads 112 on first surfaces 106F; forming via apertures 522 through dielectric strip 108 to expose bond pads 112 (FIG. 5); and filling via apertures 522 with an electrically conductive material to form vias 624 electrically coupled to bond pads 112 (FIG. 6).

Thus, in accordance with this embodiment of the present invention, bond pads 112 are directly connected to corresponding vias 624. Stated another way, bond pads 112 are electrically connected to corresponding vias 624 without the use of a solder, e.g., without the use of flip chip bumps, and without the need to form a solder wetting layer, e.g., a nickel/gold layer, on bond pads 112. This maximizes the reliability of the electrical connection between vias 624 and bond pads 112, while at the same time minimizes impedance.

Figure 1A:
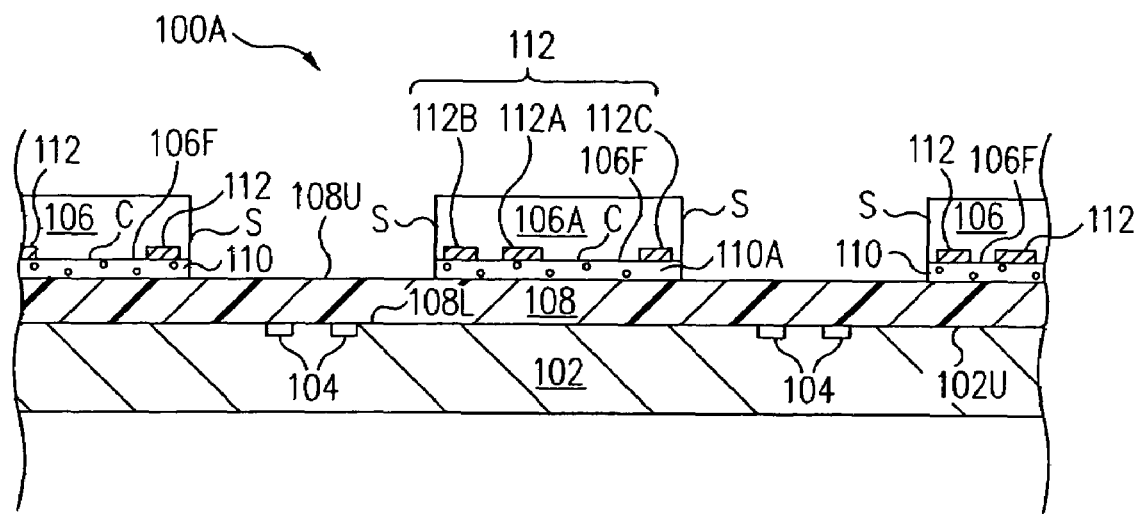
FIG. 1A is a cross-sectional view of an assembly during the fabrication of a plurality of wafer level electronic component packages in accordance with one embodiment of the present invention.

More particularly, FIG. 1A is a cross-sectional view of an assembly 100A during the fabrication of a plurality of wafer level electronic component packages in accordance with one embodiment of the present invention. Referring now to FIG. 1A, assembly 100A includes a rigid support strip 102, e.g., an aluminum, copper or stainless steel plate. Support strip 102 includes fiducials 104 on an upper, e.g., first, surface 102U of support strip 102. Fiducials 104 are used for alignment and mounting of electronic components 106, e.g., integrated circuit chips, as discussed further below.

A dielectric strip 108 is mounted to support strip 102. Electronic components 106 are mounted to dielectric strip 108 with adhesives 110, e.g., liquid adhesives or double-sided sticky tapes, although other adhesives are used in other embodiments. To illustrate, a first electronic component 106A of the plurality of electronic components 106 is mounted to dielectric strip 108 with a first adhesive 110A of the plurality of adhesives 110. Dielectric strip 108, sometimes called a first dielectric strip, and adhesives 110 are electrical insulators, i.e., dielectrics.

More particularly, front, e.g., first, surfaces 106F of electronic components 106 are mounted to an upper, e.g., first, surface 108U of dielectric strip 108 with adhesives 110. A lower, e.g., second, surface 108L of dielectric strip 108 is mounted to upper surface 102U of support strip 102. For example, dielectric strip 108 is tacky, sometimes called sticky, and is simply pressed against support strip 102 to mount dielectric strip 108 to support strip 102.

In one embodiment, adhesives 110 are applied to front surfaces 106F of electronic components 106 while electronic components 106 are still in wafer form, i.e., before they are singulated.

In one embodiment, dielectric strip 108 is transparent such that fiducials 104 are visible through dielectric strip 108. Electronic components 106 are aligned to fiducials 104 and mounted to dielectric strip 108 with adhesives 110, e.g., using an optical alignment system. Adhesives 110 are cured, if necessary.

In one embodiment, electronic components 106 are mounted in a single row on dielectric strip 108.

However, in other embodiments, electronic components 106 are mounted in an array on dielectric strip 108.

Illustratively, electronic components 106 are mounted in a 2×2, 3×3, . . . , or nxm array. In yet another embodiment, only a single electronic component 106 is mounted to dielectric strip 108, i.e., the wafer level electronic component package is fabricated as an individual unit instead of as one of a plurality of units fabricated simultaneously.

Formed on front surface 106F of electronic components 106 are bond pads 112, e.g., formed of aluminum. Bond pads 112 are connected to the internal circuitry of electronic components 106.

In one embodiment, bond pads 112 are distributed in an array on front surface 106F. In another embodiment, bond pads 112 are formed on front surface 106F directly adjacent sides S of electronic components 106 in a typical wirebond configuration pattern.

Figure 1B:
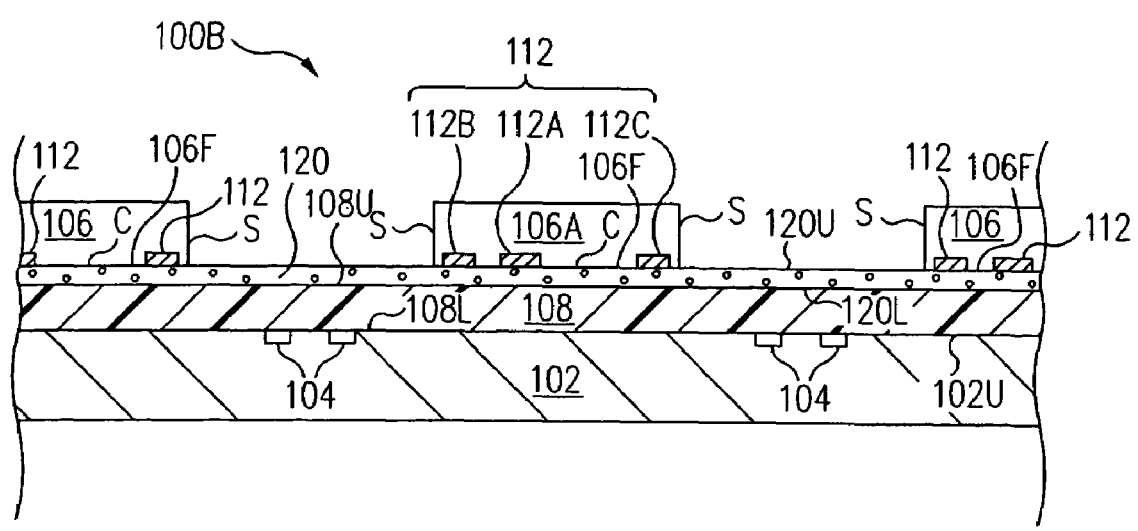
FIG. 1B is a cross-sectional view of an assembly during the fabrication of a plurality of wafer level electronic component packages in accordance with another embodiment of the present invention.

FIG. 1B is a cross-sectional view of an assembly 100B during the fabrication of a plurality of wafer level electronic component packages in accordance with another embodiment of the present invention. Assembly 100B of FIG. 1B is similar to assembly 100A of FIG. 1A and only the significant differences are discussed below.

Referring now to FIGS. 1A and 1B together, instead of mounting electronic components 106 to dielectric strip 108 using individual adhesives 110 as illustrated in FIG. 1A, an adhesive strip 120 (FIG. 1B) is used to mount electronic components 106.

Adhesive strip 120 is an electrical insulator. Illustratively, adhesive strip 120 is a liquid adhesive, for example, applied by spin coating. As another example, adhesive strip 120 is a double-sided sticky tape although other adhesives are used in other embodiments.

More particularly, a lower, e.g., first, surface 120L of adhesive strip 120 is mounted to upper surface 108U of dielectric strip 108. Front surfaces 106F of electronic components 106 are mounted to an upper, e.g., second, surface 120U of adhesive strip 120. Although use of adhesive strip 120 is illustrated in the figures which follow and discussed below for purposes of simplicity, it is to be understood that adhesives 110 (FIG. 1A) are used instead of adhesive strip 120 in an alternative embodiment.

Figure 2:
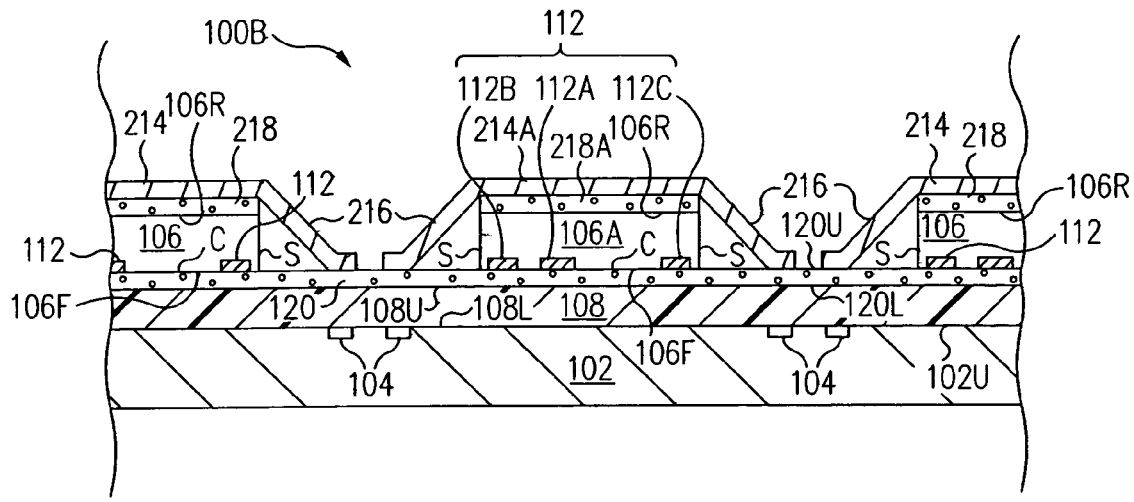
FIGS. 2, 3, 4, 5, 6, 7, 8, 9, 10 and 11 are cross-sectional views of the assembly of FIG. 1B at further stages during the fabrication of a plurality of wafer level electronic component packages in accordance with various embodiments of the present invention.

FIG. 2 is a cross-sectional view of assembly 100B of FIG. 1B at a further stage during the fabrication of a plurality of wafer level electronic component packages in accordance with one embodiment of the present invention. Referring now to FIG. 2, heat sinks 214, e.g., copper slugs, are mounted to rear, e.g., second, surfaces 106R of electronic components 106. During use, heat sinks 214 enhance heat dissipation from electronic components 106 to the ambient environment.

To illustrate, a first heat sink 214A of the plurality of heat sinks 214 is mounted to rear surface 106R of electronic component 106A.

In one embodiment, legs 216 of heat sinks 214 adhere to adhesive strip 120 to hold heat sinks 214 in place. In accordance with one embodiment, a thermal pad or grease is used between heat sinks 214 and rear surfaces 106R of electronic components 106 to enhance heat transfer from electronic components 106 to heat sinks 214.

In another embodiment, adhesives 218, e.g., thermal adhesives having a relatively high heat transfer coefficient, mount heat sinks 214 to rear surface 106R of electronic components 106. To illustrate, heat sink 214A is mounted to rear surface 106R of electronic component 106A with a first adhesive 218A of the plurality of adhesives 218.

Although heat sinks 214 are not illustrated in the figures which follow or discussed further below for purposes of simplicity, it is to be understood that the assembly is fabricated to include heat sinks 214 in an alternative embodiment.

Figure 3:
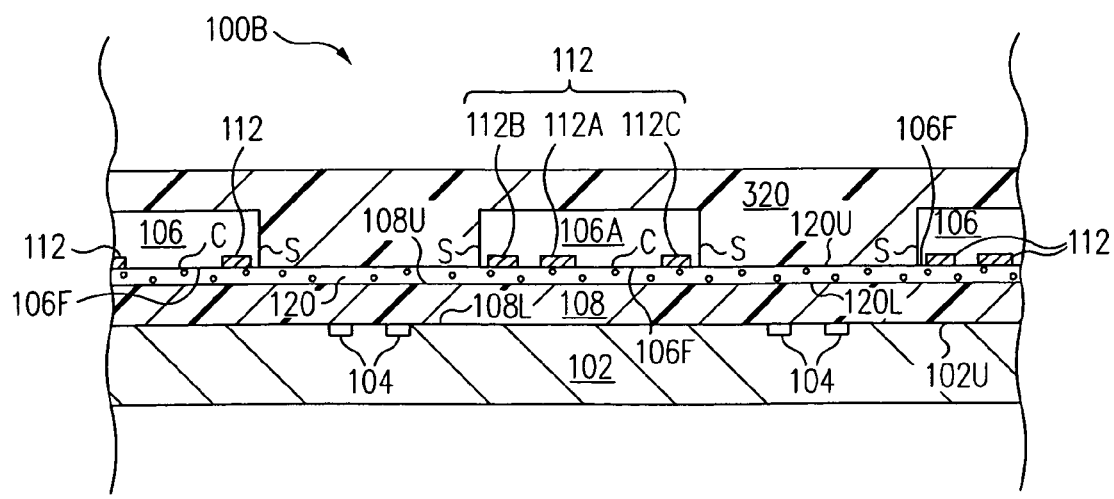

FIG. 3 is a cross-sectional view of assembly 100B of FIG. 1B at a further stage during the fabrication of a plurality of wafer level electronic component packages in accordance with one embodiment of the present invention. Referring now to FIG. 3, electronic components 106 are encapsulated, sometimes called overmolded, in an encapsulant 320. Encapsulant 320 protects electronic components 106 from the ambient environment.

Illustratively, a liquid encapsulant is applied and cured to form encapsulant 320. In another embodiment, a plastic encapsulant is applied, e.g., using a transfer or injection mold process, to form encapsulant 320.

Figure 4:
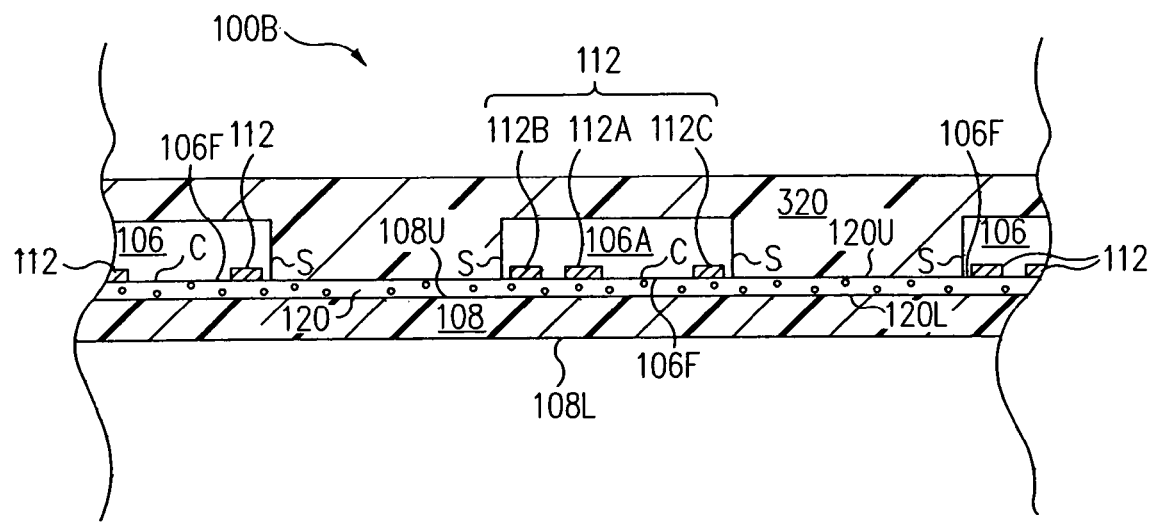

FIG. 4 is a cross-sectional view of assembly 100B of FIG. 3 at a further stage during the fabrication of a plurality of wafer level electronic component packages in accordance with one embodiment of the present invention. Referring now to FIGS. 3 and 4 together, support strip 102 is removed from dielectric strip 108. In one embodiment, upper surface 102U of support strip 102 is pretreated, e.g., a release agent is applied, to facilitate easy removal of support strip 102. In one embodiment, support strip 102 is reusable and thus reused to fabricate another assembly 100B as illustrated in FIG. 1B after removal from dielectric strip 108 thus minimizing the cost of fabricating assembly 100B.

Once support strip 102 is removed, encapsulant 320 provides rigidity and support for assembly 100B. Further, removal of support strip 102 exposes lower surface 108L of dielectric strip 108 for further processing as discussed further below.

FIG. 5 is a cross-sectional view of assembly 100B of FIG. 4 at a further stage during the fabrication of a plurality of wafer level electronic component packages in accordance with one embodiment of the present invention. Referring now to FIG. 5, a plurality of via apertures 522 are formed using a laser, i.e., using laser ablation. Via apertures 522 are sometimes called first via apertures.

Via apertures 522 extend through dielectric strip 108 and through adhesive strip 120 to bond pads 112 of electronic components 106. In one embodiment, via apertures 522 are cylindrical in shape. Bond pads 112 are exposed through via apertures 522.

In one embodiment, the laser intensity is set to be sufficient to remove dielectric strip 108 and adhesive strip 120. However, the laser intensity is set to be insufficient to remove bond pads 112. Accordingly, pulsing of the laser forms a single via aperture 522 extending through dielectric strip 108 and through adhesive strip 120 to a bond pad 112 of electronic components 106. The laser is then stepped to the next location to form the next via aperture 522.

To illustrate, electronic component 106A includes bond pads 112A, 112B, 112C on front surface 106F of electronic component 106A. Via apertures 522A, 522B, 522C of the plurality of via apertures 522 extend through dielectric strip 108 and through adhesive strip 120 to bond pads 112A, 112B, 112C, respectively.

To further illustrate, initially, the laser is pulsed to form via aperture 522A. The laser is then stepped and pulsed again to form via aperture 522B. The laser is then stepped and pulsed again to form via aperture 522C. The laser is stepped and pulsed repeatedly until all of via apertures 522 are formed. However, in another embodiment, a plurality of lasers are simultaneous pulsed to form some or all of via apertures 522 simultaneously. In yet other embodiments, via apertures 522 are formed using selective etching, mechanical drilling, or other techniques.

FIG. 6 is a cross-sectional view of assembly 100B of FIG. 5 at a further stage during the fabrication of a plurality of wafer level electronic component packages in accordance with one embodiment of the present invention. Referring now to FIGS. 5 and 6 together, via apertures 522 are filled with an electrically conductive material, e.g., a metal or metal containing material, an electrically conductive adhesive such as a silver filled adhesive or polymer, or solder paste, to form electrically conductive vias 624. Vias 624 are sometimes called first vias.

In one embodiment, copper or a copper containing material is plated in via apertures 522 to form vias 624. In another embodiment, via apertures 522 are filled with an electrically conductive adhesive, which is then cured if necessary, to form vias 624. In yet another embodiment, via apertures 522 are filled with a solder paste. Assembly 100B is then heated to reflow the solder paste to form vias 624.

After formation of vias 624, any excess electrically conductive material formed on lower surface 108L of dielectric strip 108 is removed. Illustratively, an etch or physical grinding process is used.

In one embodiment, an over-etch process is used to slightly over-etch vias 624. Thus, vias 624 remain recessed within via apertures 522. This ensures that shorting between vias 624 from excess electrically conductive material is avoided.

Vias 624 are electrically connected to corresponding bond pads 112. To illustrate, vias 624A, 624B, 624C of the plurality of vias 624 are electrically connected to bond pads 112A, 112B, 112C, respectively. Vias 624 extend from bond pads 112, through adhesive strip 120 and through dielectric strip 108 to be adjacent or slightly recessed from (above in the view of FIG. 6) lower surface 108L of dielectric strip 108.

Bond pads 112 are directly connected to corresponding vias 624. Stated another way, bond pads 112 are electrically connected to corresponding vias 624 without the use of a solder, e.g., without the use of flip chip bumps, and without the need to form a solder wetting layer, e.g., a nickel/gold layer, on bond pads 112. This maximizes the reliability of the electrical connection between vias 624 and bond pads 112, while at the same time minimizes impedance.

Further, since dielectric strip 108 is directly attached to electronic components 106 by adhesive strip 120 and bond pads 112 are directly connected to corresponding vias 624, the use of an underfill material is obviated. This simplifies manufacturing, enhances reliability, and thus reduces cost.

After formation of vias 624, assembly 100B is inspected, e.g., optically using an automatic inspection system, to insure that all via apertures 522 are properly filled with electrically conductive material, i.e., to inspect the integrity of vias 624. In one embodiment, any defective or unformed vias 624 detected during the inspection are corrected, e.g., by etch removal of vias 624, reapplication of the electrically conductive material to reform vias 624, e.g., re-plating, and removal of any excess electrically conductive material on lower surface 108L of dielectric strip 108.

In this manner, the wafer level electronic component packages are fabricated with a maximum yield, e.g., essentially a 100 percent yield. This further minimizes the fabrication cost of the wafer level electronic component packages.

Figure 7:
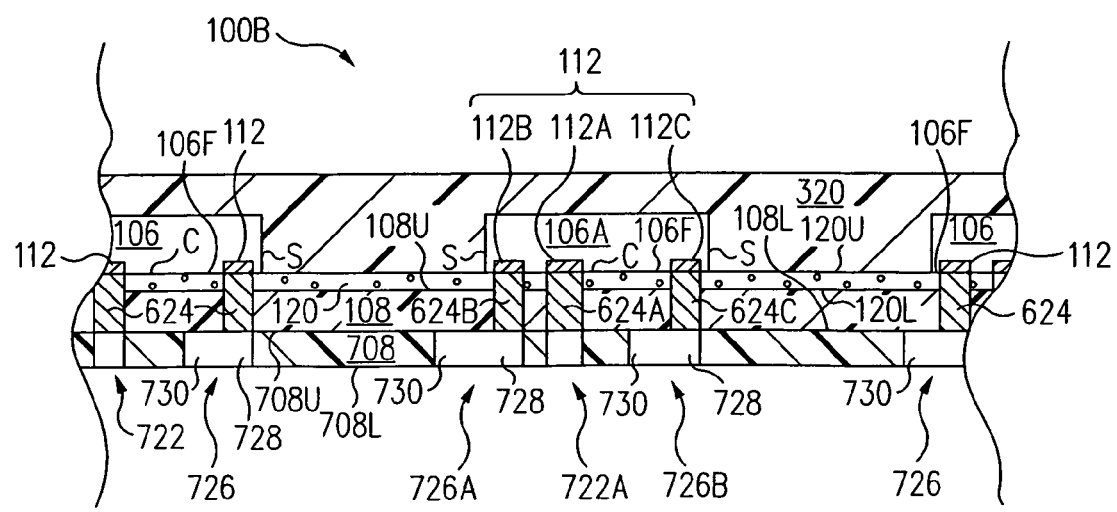

FIG. 7 is a cross-sectional view of assembly 100B of FIG. 6 at a further stage during the fabrication of a plurality of wafer level electronic component packages in accordance with one embodiment of the present invention. Referring now to FIG. 7, a second dielectric strip 708 is mounted to dielectric strip 108. More particularly, an upper, e.g., first, surface 708U of dielectric strip 708 is mounted to lower surface 108L of dielectric strip 108.

For example, dielectric strip 708 is mounted to dielectric strip 108 using a tack cure. More particularly, dielectric strip 708 is pressed on to dielectric strip 108. Assembly 100B is heated to fuse together and bond dielectric strip 708 to dielectric strip 108.

Illustratively, dielectric strip 108 and dielectric strip 708 are polytetrafluoroethylene (PTFE), liquid crystal polymer (LCP) or a non woven arimid although other low-K dielectric materials are used in other embodiments.

A plurality of via apertures 722 and trace channels 726 are formed using a laser, i.e., using laser ablation. Via apertures 722 and trace channels 726 extend through dielectric strip 708 and to vias 624. Via apertures 722 are sometimes called second via apertures.

In one embodiment, via apertures 722 are cylindrical in shape and extend vertically, i.e., in a first direction perpendicular to front surface 106F of electronic components 106, through dielectric strip 708 to vias 624. Trace channels 726 are trenches extending horizontally, i.e., in a second direction perpendicular to the first direction and parallel to front surface 106F of electronic components 106, from vias 624.

Vias 624 are exposed through via apertures 722 and trace channels 726. To illustrate, a first via aperture 722A of the plurality of via apertures 722 extends through dielectric strip 708 to via 624A.

To further illustrate, a first trace channel 726A of the plurality of trace channels 726 extends through dielectric strip 708 to via 624B. More particularly, via 624B is exposed at a first end 728 of trace channel 726A. Trace channel 726A extends horizontally outwards from a center C of electronic component 106A and outwards from via 624B to a second end 730 of trace channel 726A in a fan-out configuration.

To further illustrate, a second trace channel 726B of the plurality of trace channels 726 extends through dielectric strip 708 to via 624C. More particularly, via 624C is exposed at a first end 728 of trace channel 726B. Trace channel 7268 extends horizontally inwards toward center C from via 624C to a second end 730 of trace channel 726B in a fan-in configuration.

In one embodiment, a laser is stepped and pulsed repeatedly to form via apertures 722 and trace channels 726. However, in another embodiment, a plurality of lasers are simultaneous pulsed to form some or all of via apertures 722 and trace channels 726 simultaneously. During formation of trace channels 726, the laser is moved during pulsing to form the horizontal trenches of trace channels 726.

By controlling the laser intensity and pulse time, via apertures 722 and trace channels 726 are all formed to have the same depth, this depth being equal to the thickness of dielectric strip 708. This simplifies and enhances reliability of filling, e.g., plating, of via apertures 722 and trace channels 726 with an electrically conductive material as discussed below.

Figure 8:
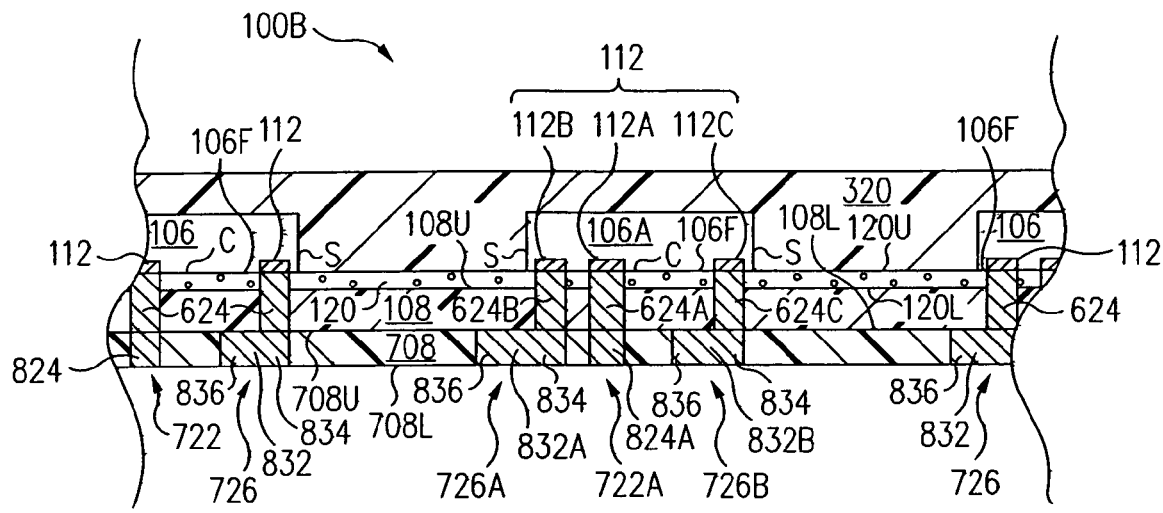

FIG. 8 is a cross-sectional view of assembly 100B of FIG. 7 at a further stage during the fabrication of a plurality of wafer level electronic component packages in accordance with one embodiment of the present invention. Referring now to FIGS. 7 and 8 together, via apertures 722 and trace channels 726 are filled with an electrically conductive material, e.g., a metal or metal containing material, an electrically conductive adhesive, or solder paste, to form electrically conductive vias 824 and electrically conductive traces 832, respectively. Vias 824 are sometimes called second vias.

In one embodiment, copper or a copper containing material is plated in via apertures 722 and trace channels 726 to form vias 824 and traces 832, respectively. In another embodiment, via apertures 722 and trace channels 726 are filled with an electrically conductive adhesive, which is then cured if necessary, to form vias 824 and traces 832, respectively. In yet another embodiment, via apertures 722 and trace channels 726 are filled with a solder paste. Assembly 100B is then heated to reflow the solder paste to form vias 824 and traces 832, respectively.

Vias 824 form vertical electrical connectors, i.e., form electrical connectors extending vertically. Traces 832 form horizontal electrical connectors, i.e., form electrical connectors extending horizontally.

After formation of vias 824 and traces 832, any excess electrically conductive material formed on a lower, e.g., second, surface 708L of dielectric strip 708 is removed. Illustratively, an etch or physical grinding process is used. In one embodiment, an over-etch process is used to slightly over-etch vias 824 and traces 832. This, ensures that shorting between vias 824 and/or traces 832 from excess electrically conductive material is avoided.

Vias 824 and traces 832 are electrically connected to corresponding vias 624. To illustrate, a first via 824A of the plurality of vias 824 is electrically connected to via 624A.

Vias 824 extend from vias 624, through dielectric strip 708 to be adjacent or recessed from lower surface 708L of dielectric strip 708.

To further illustrate, a first trace 832A of the plurality of traces 832 is electrically connected to via 624B. More particularly, a first end 834 of trace 832A is electrically connected to via 624B. Trace 832A extends horizontally outwards from a center C of electronic component 106A and outwards from via 624B to a second end 836 of trace 832A in a fan-out configuration.

To further illustrate, a second trace 832B of the plurality of traces 832 is electrically connected to via 624C. More particularly, a first end 834 of trace 832B is electrically connected to via 624C. Trace 832B extends horizontally inwards toward center C from via 624C to a second end 836 of trace 832B in a fan-in configuration.

Although a fan-out trace and a fan-in trace, i.e., traces 832A, 832B, respectively, are illustrated and discussed, in other embodiments, only fan-in traces or fan-out traces are formed.

After formation of vias 824 and traces 832, assembly 100B is inspected to insure that all via apertures 722 and trace channels 726 are properly filled with electrically conductive material, i.e., to inspect the integrity of vias 824 and traces 832.

In one embodiment, any defective or unformed vias 824 and traces 832 detected during the inspection are corrected, e.g., by etch removal of vias 824 and traces 832, reapplication of the electrically conductive material to reform vias 824 and traces 832, and removal of any excess electrically conductive material on lower surface 708L of dielectric strip 708. In this manner, the wafer level electronic component packages are fabricated with a maximum yield.

Figure 9:
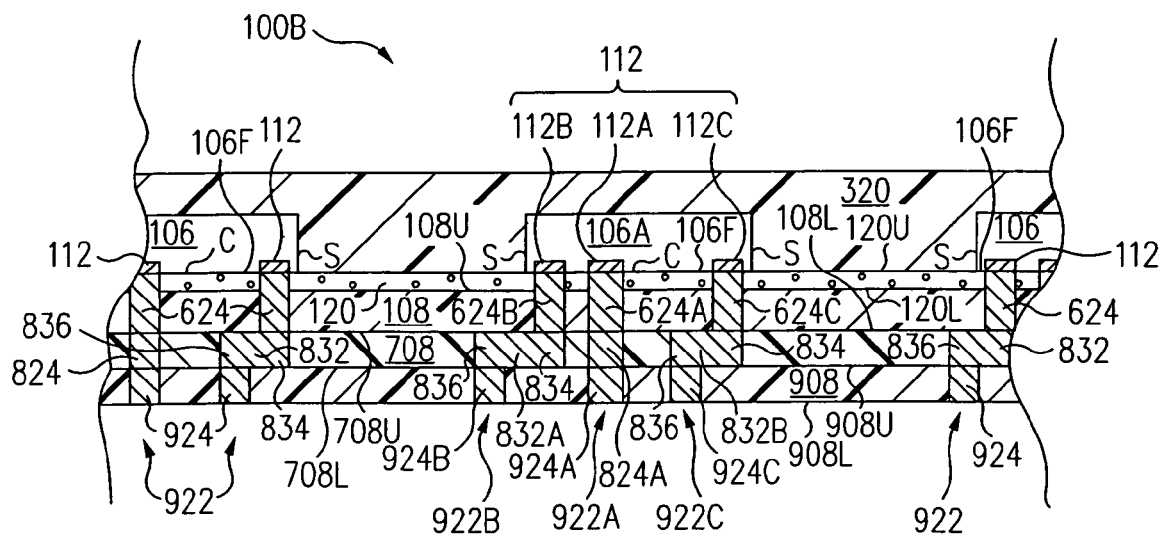

FIG. 9 is a cross-sectional view of assembly 100B of FIG. 8 at a further stage during the fabrication of a plurality of wafer level electronic component packages in accordance with one embodiment of the present invention. Referring now to FIG. 9, a third dielectric strip 908 is mounted to dielectric strip 708. More particularly, an upper, e.g., first, surface 908U of dielectric strip 908 is mounted to lower surface 708L of dielectric strip 708. Dielectric strip 908 is similar to dielectric strip 708 and mounted in a manner similar to that discussed above with regards to mounting of dielectric strip 708 to dielectric strip 108.

A plurality of via apertures 922 are formed using a laser, i.e., using laser ablation. Via apertures 922 extend through dielectric strip 908 to vias 824 and traces 832. In one embodiment, via apertures 922 are cylindrical in shape. Via apertures 922 are sometimes called third via apertures.

Vias 824 and second ends 836 of traces 832 are exposed through via apertures 922. To illustrate, via apertures 922A, 922B, 922C of the plurality of via apertures 922 extend through dielectric strip 908 to via 824A and second ends 836 of traces 832A, 832B, respectively.

Via apertures 922 are formed in a manner similar to via apertures 522 of FIG. 5 so formation of via apertures 922 is not discussed in detail to avoid detracting from the principals of the invention.

Via apertures 922 are filled with an electrically conductive material, e.g., a metal or metal containing material, an electrically conductive adhesive, or solder paste, to form electrically conductive vias 924. Via apertures 922 are filled to form vias 924 in a manner similar to that discussed with regards to vias 624 of FIG. 6 so formation of vias 924 is not discussed in detail to avoid detracting from the principals of the invention. Vias 924 are sometimes called third vias.

After formation of vias 924, any excess electrically conductive material formed on a lower, e.g., second, surface 908U of dielectric strip 908 is removed. Illustratively, an etch or physical grinding process is used. In one embodiment, an over-etch process is used to slightly over-etch vias 924. Thus, vias 924 remain recessed within via apertures 922. This ensures that shorting between vias 924 from excess electrically conductive material is avoided.

Vias 924 are electrically connected to corresponding vias 824 and second ends 836 of traces 832. To illustrate, vias 924A, 924B, 924C of the plurality of vias 924 are electrically connected to via 824A and second ends 836 of traces 832A, 832B, respectively. Vias 924 extend from vias 824 and second ends 836 of traces 832 through dielectric strip 908 to be adjacent or slightly recessed from lower surface 908L of dielectric strip 908.

In one embodiment, vias 924 are formed to have a larger diameter than the width of traces 832 and/or the diameter of vias 824. By forming vias 924 with the appropriate diameter, tolerance in the positioning of vias 924 is accommodated. Stated another way, by forming vias 924 with a sufficiently large diameter, electrical contact between vias 924 and vias 824/traces 832 is assured.

After formation of vias 924, assembly 100B is inspected to insure that all via apertures 922 are properly filled with electrically conductive material, i.e., to inspect the integrity of vias 924.

In one embodiment, any defective or unformed vias 924 detected during the inspection are corrected, e.g., by etch removal of vias 924, reapplication of the electrically conductive material to reform vias 924, and removal of any excess electrically conductive material on lower surface 908L of dielectric strip 908. In this manner, the wafer level electronic component packages are fabricated with a maximum yield.

Figure 10:
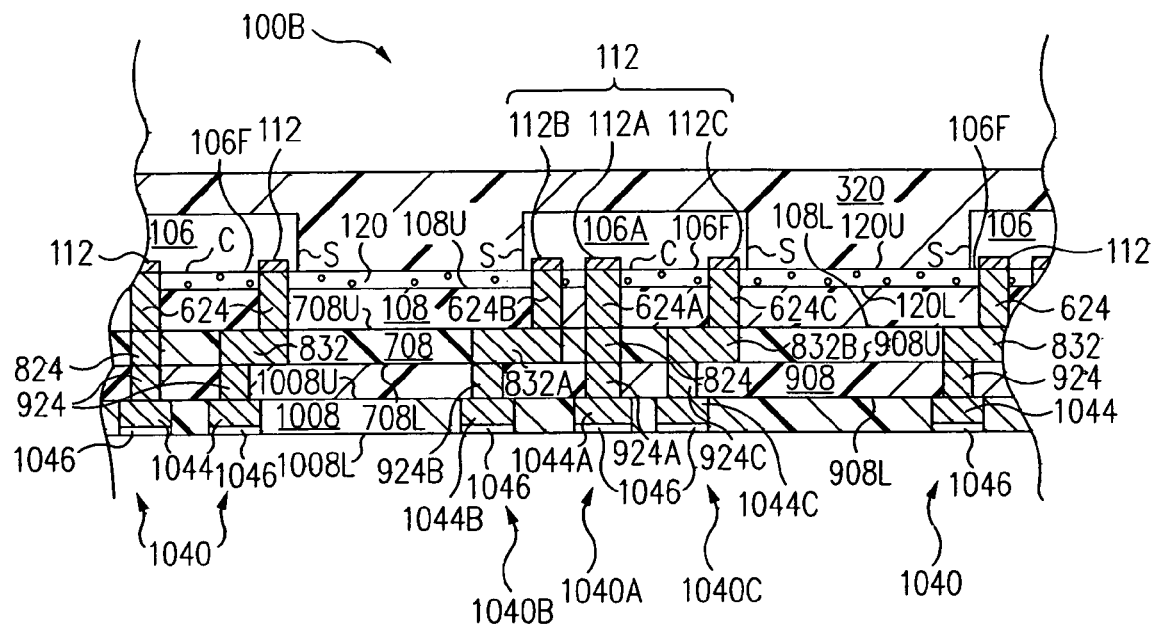

FIG. 10 is a cross-sectional view of assembly 100B of FIG. 9 at a further stage during the fabrication of a plurality of wafer level electronic component packages in accordance with one embodiment of the present invention. Referring now to FIG. 10, a fourth dielectric strip 1008 is mounted to dielectric strip 908. More particularly, an upper, e.g., first, surface 1008U of dielectric strip 1008 is mounted to lower surface 908L of dielectric strip 908. Dielectric strip 1008 is similar to dielectric strip 708 and mounted in a manner similar to that discussed above with regards to mounting of dielectric strip 708 to dielectric strip 108.

A plurality of land apertures 1040 are formed using a laser, i.e., using laser ablation. Land apertures 1040 extend through dielectric strip 1008 to vias 924. In one embodiment, land apertures 1040 are cylindrical in shape but can be patterned in a variety of shapes depending upon the particular interconnection structure used, e.g., interconnection balls or lands.

Vias 924 are exposed through land apertures 1040. To illustrate, land apertures 1040A, 1040B, 1040C of the plurality of land apertures 1040 extend through dielectric strip 1008 to vias 924A, 924B, 924C, respectively.

Land apertures 1040 are formed in a manner similar to via apertures 522 of FIG. 5 so formation of land apertures 1040 is not discussed in detail to avoid detracting from the principals of the invention.

Land apertures 1040 are filled with an electrically conductive material, e.g., a metal or metal containing material, an electrically conductive adhesive, or solder paste, to form electrically conductive lands 1044. Land apertures 1040 are filled to form lands 1044 in a manner similar to that discussed with regards to vias 624 of FIG. 6 so formation of lands 1044 is not discussed in detail to avoid detracting from the principals of the invention.

After formation of lands 1044, any excess electrically conductive material formed on a lower, e.g., second, surface 1008L of dielectric strip 1008 is removed. Illustratively, an etch or physical grinding process is used.

In one embodiment, an over-etch process is used to slightly over-etch lands 1044. Thus, lands 1044 remain recessed within land apertures 1040. This ensures that shorting between lands 1044 from excess electrically conductive material is avoided.

Lands 1044 are electrically connected to corresponding vias 924. To illustrate, lands 1044A, 1044B, 1044C of the plurality of lands 1044 are electrically connected to vias 924A, 924B, 924C, respectively. Lands 1044 extend from vias 924 through dielectric strip 1008 to be adjacent or slightly recessed from lower surface 1008L of dielectric strip 1008.

After formation of lands 1044, assembly 100B is inspected to insure that all land apertures 1040 are properly filled with electrically conductive material, i.e., to inspect the integrity of lands 1044. In one embodiment, any defective or unformed lands 1044 detected during the inspection are corrected, e.g., by etch removal of lands 1044, reapplication of the electrically conductive material to reform lands 1044, and removal of any excess electrically conductive material on lower surface 1008L of dielectric strip 1008. In this manner, the wafer level electronic component packages are fabricated with a maximum yield.

After formation of lands 1044, in one embodiment, a solder on paste (SOP) is applied to lands 1044. This solder on paste is reflowed, i.e., heated to a melt and cooled to resolidify, to form solder lands, which are represented as item 1046 in FIG. 10 in accordance with this embodiment.

In accordance with this embodiment, the resulting wafer level electronic component package is a land grid array package. The solder lands are used to electrically connect the wafer level electronic component package to the larger substrate, e.g., a mother or daughter board, for example, using a high lead solder such as a 90/10 lead/tin solder.

In another embodiment, a ball grid array package is formed. More particular, after formation of lands 1044, an organic solderability protectant (OSP), sometimes called an organic solderability preservative, is applied to lands 1044. The organic solderability protectant, which is represented as item 1046 in FIG. 10 in accordance with this embodiment, enhances the solder wet-ability of lands 1044. For simplicity of discussion, the organic solderability protectant is hereinafter referred to as OSP 1046. However, in another embodiment, OSP 1046 is not used.

Figure 11:
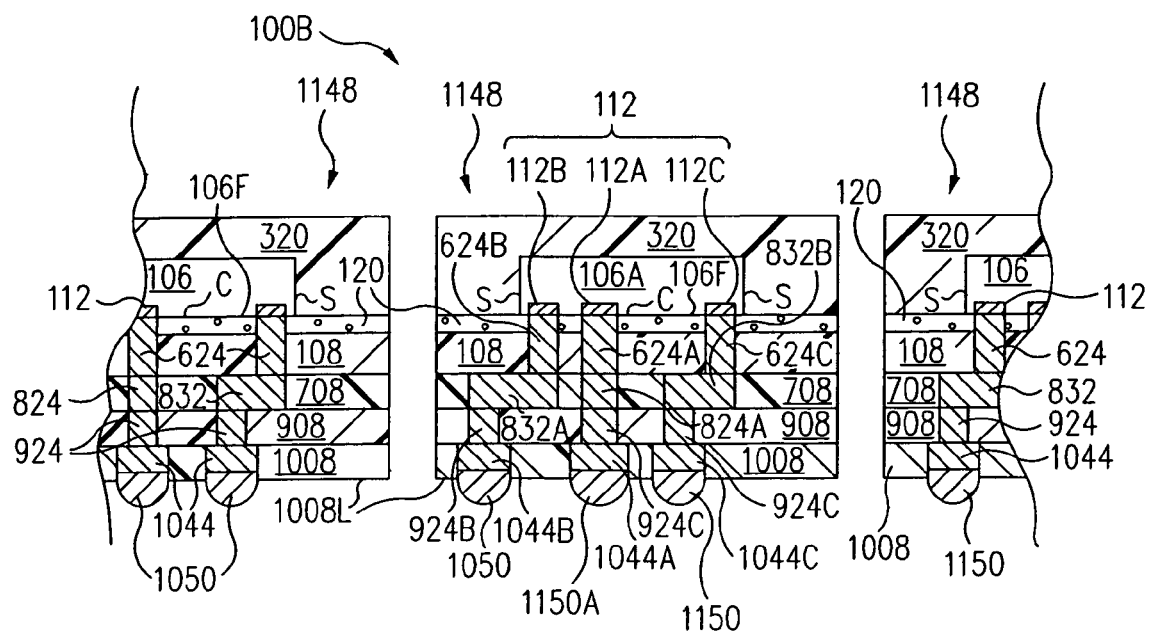

FIG. 11 is a cross-sectional view of assembly 100B of FIG. 10 at a further stage during the fabrication of a plurality of wafer level electronic component packages 1148 in accordance with one embodiment of the present invention. Referring now to FIG. 11, electrically conductive interconnection balls 1150, e.g., eutectic lead/tin solder, are formed on lands 1044. Interconnection balls 1150 are formed in a conventional manner. During formation of interconnection balls 1150, OSP 1046 is consumed.

Interconnection balls 1150 are used to electrically connect wafer level electronic component packages 1148 to the larger substrate, e.g., a mother or daughter board. Assembly 100B is then singulated, e.g., using a mechanical saw or laser, to form the plurality of wafer level electronic component packages 1148.

Each interconnection ball 1150 is electrically connected to a corresponding bond pad 112 as discussed above. In this manner, the pattern of bond pads 112 is redistributed to the pattern of interconnection balls 1150.

For example, bond pads 112 are formed on front surface 106F directly adjacent sides S of electronic components 106 in a typical wirebond configuration pattern. However, interconnection balls 1150 are distributed in an array pattern. Thus, the wirebond configuration pattern of bond pads 112 is redistributed to an array pattern of interconnection balls 1150. Although an array pattern of interconnection balls 1150 is discussed above, interconnection balls 1150 are distributed in any one of a number of desired patterns in other embodiments.

Further, interconnection balls 1150 are connected to bond pads 112 using a minimum path length. To illustrate, bond pad 112A is coupled to a first interconnection ball 1150A of the plurality of interconnection balls 1150 by vias 624A, 824A, 924A, land 1044A, which are directly aligned with one another. By using a minimum path length, heat transfer between bond pads 112 and more generally between electronic components 106 and interconnection balls 1150 is maximized thus improving the thermal performance of wafer level electronic component packages 1148. For similar reasons, impedance between bond pads 112 and interconnection balls 1150 is minimized As set forth above, (1) a dielectric strip is applied; (2) the dielectric strip is laser patterned to form via apertures and/or trace channels; (3) the via apertures and/or trace channels are filled with electrically conductive material to form vias and/or traces; (4) excess electrically conductive material is removed from the lower surface of the dielectric strip; and (5) the formed vias and/or traces are inspected and corrected, if necessary. This process is repeated any number of desired times until the desired redistribution is achieved.

Further, since the via apertures 522, 722, 922 and/or trace channels 726 are formed with a laser in one embodiment, any changes in the design layout of the via apertures 522, 722, 922 and/or trace channels 726 are relatively simple to execute. More particularly, these design layout changes are made in the computer software, e.g., the CAD software, which drives the laser. Accordingly, the design layout changes are made with some relatively simple programming and executed immediately.

Referring still to FIG. 11, although four dielectric strips 108, 708, 908, 1008 are illustrated and discussed above, more or less than four dielectric strips are used in other embodiments. Generally, at least one dielectric strip, e.g., dielectric strip 108, is used.

Further, although vias 624, 824, 924, traces 832, and lands 1044 are discussed above as being formed in various dielectric strips 108, 708, 908, and 1008 for purposes of discussion, in light of this disclosure, those of skill in the art will understand that vias, traces, lands and/or combinations thereof can be formed in any single dielectric strip 108, 708, 908, or 1008.

Further, although vias 624, 824, 924, traces 832, and lands 1044 are discussed as distinct types of structures for purposes of discussion, in light of this disclosure, those of skill in the art will understand, that vias 624, 824, 924, traces 832, and lands 1044 can be similar in structure. For example, a via or trace can form a land.

Still further, via apertures 522, 722, 922, trace channels 726 and land apertures 1040 are filled immediately after formation, i.e., before application of the next dielectric strip, with an electrically conductive material to form the vias 624, 824, 924, traces 832 and lands 1044, respectively, in the discussion above. However, in an alternative embodiment, via apertures 522, 722, 922, trace channels 726 and land apertures 1040 are formed in some or all of dielectric strips 108, 708, 908, 1008. After formation, via apertures 522, 722, 922, trace channels 726 and land apertures 1040 are filled at the same time, e.g., in a single plating operation, with an electrically conductive material to form vias 624, 824, 924, traces 832 and lands 1044, respectively.

Figure 12:
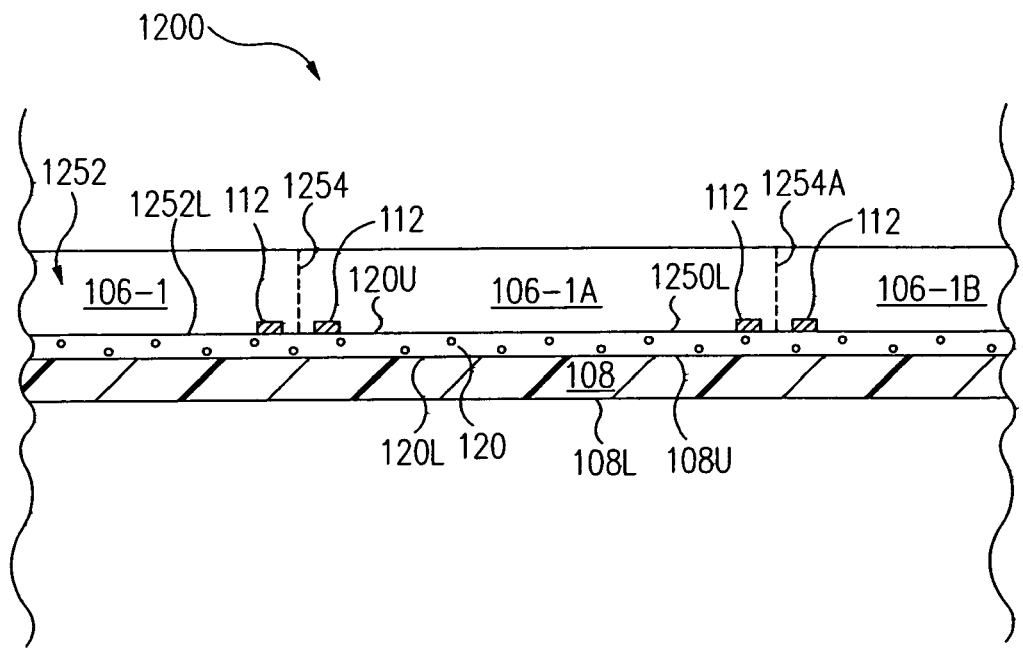
FIG. 12 is a cross-sectional view of an assembly during the fabrication of a plurality of wafer level electronic component packages in accordance with another embodiment of the present invention.

FIG. 12 is a cross-sectional view of an assembly 1200 during the fabrication of a plurality of wafer level electronic component packages in accordance with one embodiment of the present invention. Referring now to FIG. 12, assembly 1200 includes an electronic component substrate 1252 such as a silicon wafer. Electronic component substrate 1252 includes a plurality of electronic components 106-1 integrally connected together. Electronic components 106-1 include bond pads 112 on front surfaces 106F of electronic components 106-1, and more generally on a lower, e.g., first, surface 1252L of electronic component substrate 1252.

Electronic components 106-1 are integrally connected together in an array, e.g., a 2×2, 3×3 ... or nxm array. Each of electronic components 106-1 is delineated by a singulation street 1254, which is located between adjacent electronic components 106-1. For example, a first singulation street 1254A of the plurality of singulation streets 1254 delineates a first electronic component 106-1A from a second electronic component 106-1B of the plurality of electronic components 106-1. The other electronic components 106-1 are similarly delineated from adjacent electronic components 106-1 by corresponding singulation streets 1254.

Upper surface 108U of dielectric strip 108 is mounted to front surfaces 106F of electronic components 106-1, and more generally to lower surface 1252L of electronic component substrate 1252 with adhesive strip 120. Electronic component substrate 1252 provides rigidity and support for assembly 1200.

Figure 13:
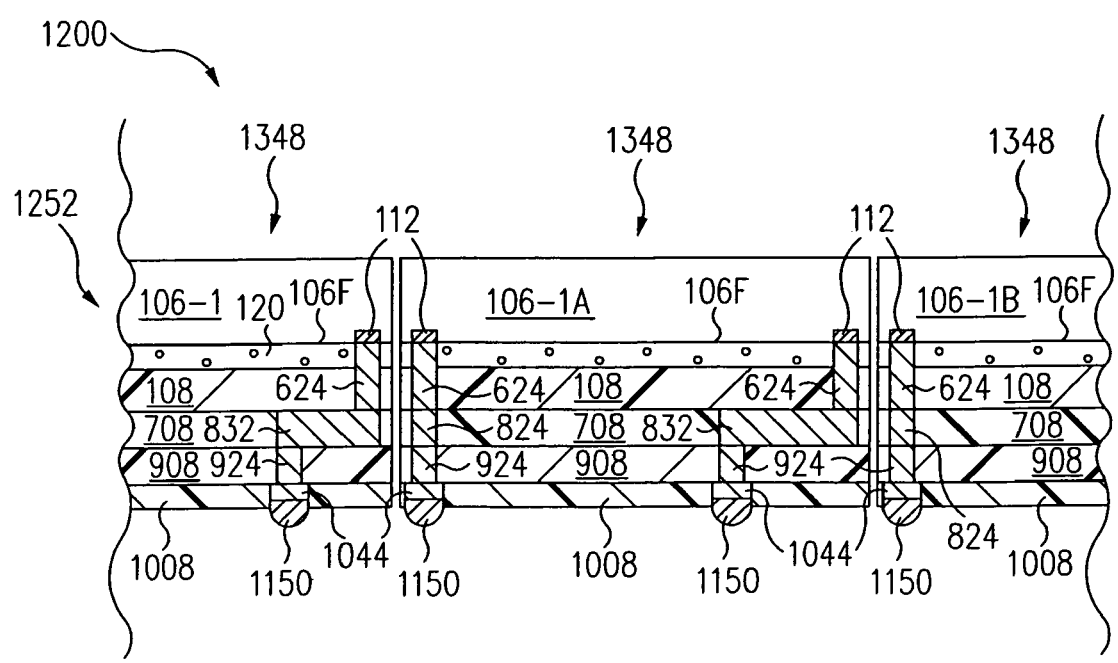
FIG. 13 is a cross-sectional view of the assembly of FIG. 12 at a further stage during the fabrication of a plurality of wafer level electronic component packages in accordance with one embodiment of the present invention.

FIG. 13 is a cross-sectional view of assembly 1200 of FIG. 12 at a further stage during the fabrication of a plurality of wafer level electronic component packages in accordance with one embodiment of the present invention.

Referring now to FIG. 13, vias 624, 824, 924, traces 832, and lands 1044 are formed in dielectric strips 108, 708, 908, and 1008 as discussed above in reference to FIGS. 5-11, the discussion of which is incorporated herein by reference in its entirety.

In the embodiment illustrated in FIG. 13, interconnection balls 1150 are formed on lands 1044 to form a ball grid array (BGA) package. Each interconnection ball 1150 is coupled to a corresponding bond pad 112. However, it is to be understood that a land grid array (LGA) package can also be fabricated.

Processing of assembly 1200 is a true wafer scale process. After formation of vias 624, 824, 924, traces 832, lands 1044 in dielectric strips 108, 708, 908, 1008, assembly 1200 is singulated along singulation streets 1254 (FIG. 12) resulting in the fabrication of wafer level electronic component packages 1348. Singulation is performed before or after fabrication of interconnection balls 1150.

This disclosure provides exemplary embodiments of the present invention. The scope of the present invention is not limited by these exemplary embodiments. Numerous variations, whether explicitly provided for by the specification or implied by the specification or not, such as variations in structure, dimension, type of material and manufacturing process may be implemented by one of skill in the art in view of this disclosure.

What is claimed is:

1. An electronic component package comprising:
   an electronic component comprising a first surface comprising a bond pad;
   a first dielectric strip coupled to the first surface of the electronic component;

a first via extending through the first dielectric strip and being coupled to the bond pad;

a second dielectric strip coupled to the first dielectric strip; and a fan-in trace formed in the second dielectric strip and coupled to the first via, wherein the fan-in trace extends inwards in a fan-in configuration.

2. The electronic component package of claim 1 wherein the first dielectric strip is coupled to the first surface of the electronic component with an adhesive.

3. The electronic component package of claim 2 wherein the first via extend through the adhesive.

4. The electronic component package of claim 3 wherein the bond pad is directly connected to the first via.

5. The electronic component package of claim 1 wherein the fan-in trace extends inwards towards a center of the electronic component.

6. The electronic component package of claim 1 wherein the fan-in trace comprises a first end electrically connected to the first via.

7. The electronic component package of claim 6 wherein the fan-in trace extends inwards from the first end to a second end of the fan-in trace.

8. The electronic component package of claim 7 further comprising:

a third dielectric strip coupled to the second dielectric strip; and a via extending through the third dielectric strip and electrically coupled to the second end of the fan-in trace.

9. The electronic component package of claim 1 wherein the first via extends from the bond pad in a first direction perpendicular to the first surface of the electronic component.

10. The electronic component package of claim 9 wherein the fan-in trace extends in a second direction perpendicular to the first direction and parallel to the first surface of the electronic component.

11. The electronic component package of claim 1 further comprising a laser-ablated via aperture, the first via comprising electrically conductive material in the laser-ablated via aperture.

12. The electronic component package of claim 11 wherein the first via is formed by plating the electrically conductive material in the laser-ablated via aperture.

13. The electronic component package of claim 1 further comprising a laser-ablated trace channel, the fan-in trace comprising electrically conductive material in the laser-ablated trace channel.

14. The electronic component package of claim 13 wherein the fan-in trace is formed by plating the electrically conductive material in the laser-ablated trace channel.

15. The electronic component package of claim 1 wherein the electronic component is one of a plurality of electronic components integrally connected together in an electronic component substrate.

16. An electronic component package comprising:

an electronic component comprising a first surface comprising a bond pad;

a first dielectric strip coupled to the first surface of the electronic component;

a first via extending through the first dielectric strip and being coupled to the bond pad;

a second dielectric strip coupled to the first dielectric strip; and a fan-out trace formed in the second dielectric strip and coupled to the first via, wherein the fan-out trace extends outwards in a fan-out configuration.

17. The electronic component package of claim 16 wherein the fan-out trace extends outwards from a center of the electronic component.

18. The electronic component package of claim 16 wherein the fan-out trace comprises:

a first end electrically connected to the first via; and a second end, wherein the fan-out trace extends outwards from the first end to the second end.

19. An electronic component package comprising:

an electronic component comprising a first surface comprising a first bond pad and a second bond pad;

a first dielectric strip coupled to the first surface of the electronic component;

a first via extending through the first dielectric strip and being coupled to the first bond pad;

a second via extending through the first dielectric strip and being coupled to the second bond pad;

a second dielectric strip coupled to the first dielectric strip;

a fan-out trace formed in the second dielectric strip and coupled to the first via, wherein the fan-out trace extends outwards in a fan-out configuration; and a fan-in trace formed in the second dielectric strip and coupled to the second via, wherein the fan-in trace extends inwards in a fan-in configuration.

20. The electronic component package of claim 19 wherein the fan-out trace comprises:

a first end electrically connected to the first via; and a second end, wherein the fan-out trace extends outwards from the first end to the second end; and wherein the fan-in trace comprises:

a first end electrically connected to the second via; and a second end, wherein the fan-in trace extends inwards from the first end of the fan-in trace to the second end of the fan-in trace.

\* \* \* \* \*